United States Patent
Naruse (10) Patent No.: US 11,915,987 B2
(45) Date of Patent: Feb. 27, 2024

(54) SEMICONDUCTOR DEVICE

(71) Applicant: AISIN CORPORATION, Kariya (JP)

(72) Inventor: Takanobu Naruse, Kariya (JP)

(73) Assignee: AISIN CORPORATION, Aichi (JP)

( * ) Notice: Subject to any disclaimer, the term of this patent is extended or adjusted under 35 U.S.C. 154(b) by 436 days.

(21) Appl. No.: 17/415,402

(22) PCT Filed: Dec. 4, 2019

(86) PCT No.: PCT/JP2019/047327
§ 371 (c)(1),
(2) Date: Jun. 17, 2021

(87) PCT Pub. No.: WO2020/179161
PCT Pub. Date: Sep. 10, 2020

(65) Prior Publication Data
US 2022/0068734 A1    Mar. 3, 2022

(30) Foreign Application Priority Data
Mar. 5, 2019 (JP) ................. 2019-039471

(51) Int. Cl.
*H01L 23/48* (2006.01)
*H01L 23/52* (2006.01)
(Continued)

(52) U.S. Cl.
CPC .......... *H01L 23/12* (2013.01); *H01L 23/66* (2013.01); *H01L 25/16* (2013.01); *H02M 3/155* (2013.01);
(Continued)

(58) Field of Classification Search
CPC ......... H01L 23/12; H01L 23/66; H01L 25/16; H01L 27/124; H01L 2924/0002;
(Continued)

(56) References Cited

U.S. PATENT DOCUMENTS 8,164,916 B1 * 4/2012 Shi .................. H01L 23/50
361/780
2009/0051466 A1    2/2009 Nishijima
(Continued)

FOREIGN PATENT DOCUMENTS

JP    H11186771 A    7/1999
JP    2009-038950 A    2/2009
(Continued)

OTHER PUBLICATIONS

Supplementary European Search Report dated Mar. 25, 2022 in European Application No. 19917796.5.
(Continued)

*Primary Examiner* — Niki H Nguyen
(74) *Attorney, Agent, or Firm* — Sughrue Mion, PLLC (57) ABSTRACT

A semiconductor device including a power supply circuit to supply power to a circuit formed on a main substrate equipped with a circuit module is made smaller in size. A semiconductor device includes: a circuit module including a module substrate and a circuit element mounted on the module substrate; and a main substrate on which the circuit module is mounted. The semiconductor device further includes a power supply circuit to supply power to at least a circuit formed on the module substrate. The power supply circuit includes: a voltage generating circuit to output a predetermined output voltage; a first capacitor; and a second capacitor larger in capacity than the first capacitor. The voltage generating circuit and the first capacitor are mounted on the module substrate. The second capacitor is mounted on the main substrate.

7 Claims, 3 Drawing Sheets

(51) Int. Cl.
- H01L 29/40 (2006.01)
- H01L 23/12 (2006.01)
- H01L 23/66 (2006.01)
- H01L 25/16 (2023.01)
- H02M 3/155 (2006.01)
- H05K 1/02 (2006.01)
- H05K 1/11 (2006.01)
- H05K 1/18 (2006.01)

(52) U.S. Cl.
CPC ........... H05K 1/0231 (2013.01); H05K 1/115 (2013.01); H05K 1/181 (2013.01); H05K 2201/10015 (2013.01)

(58) Field of Classification Search
CPC ....... H01L 2924/13055; H01L 29/7869; H01L 27/1222; H01L 2924/3011; H01L 2924/181; H01L 24/48; H01L 2224/49111; H01L 28/40; H01L 27/12; H01L 23/50; H01L 25/18; H01L 28/60; H01L 2924/19107; H01L 2224/49171; H01L 23/473; H01L 2924/01079; H01L 2924/01078; H01L 2224/05554; H01L 24/45; H01L 27/088; H01L 2924/01019; H01L 2924/01004; H01L 2924/01006; H01L 23/49822; H01L 2924/01029; H01L 24/32; H01L 2924/01082; H01L 28/90; H01L 29/786; H01L 2924/09701; H01L 27/14645; H01L 23/3107; H01L 23/5227; H01L 27/14665; H01L 29/66969; H01L 2924/19042; H01L 24/06; H01L 2924/01015; H01L 27/14627; H01L 23/49562; H01L 29/7397; H01L 2224/05599; H01L 27/1461; H01L 21/84; H01L 2224/32145; H01L 2924/15787; H01L 29/1033; H01L 29/66181; H01L 2924/19106; H01L 29/94; H02M 3/155; H05K 1/0231; H05K 1/115; H05K 1/181; H05K 2201/10015

See application file for complete search history.

(56) References Cited

U.S. PATENT DOCUMENTS

| | | | |
|---|---|---|---|
| 2018/0158772 A1* | 6/2018 | Tanaka | H01L 25/16 |
| 2018/0204827 A1* | 7/2018 | Betsui | H01L 24/16 |

FOREIGN PATENT DOCUMENTS

| | | | | |
|---|---|---|---|---|
| JP | 2015162517 A | * | 9/2015 | ........... H05K 1/0262 |
| KR | 20130047734 A | * | 5/2013 | ........... H05K 1/0262 |

OTHER PUBLICATIONS

International Search Report for PCT/JP2019/047327 dated Mar. 3, 2020 [PCT/ISA/210].

Written Opinion for PCT/JP2019/047327 dated Mar. 3, 2020 [PCT/ISA/237].

Kang Wook Lee et al., "High Density Fan-Out Technology for Advanced SiP and 3D Heterogeneous Integration", Amkor Technology Korea, Inc., 2018, pp. 1-4 (4 pages total).

* cited by examiner

SEMICONDUCTOR DEVICE

CROSS REFERENCE TO RELATED APPLICATIONS

This Application Is A National Stage of International Application No. PCT/JP2019/047327 filed Dec. 4, 2019, claiming priority based on Japanese Patent Application No. 2019-039471, filed Mar. 5, 2019, the contents of which are incorporated in their entirety.

TECHNICAL FIELD

The present disclosure relates to semiconductor devices each including a circuit module and a main substrate on which the circuit module is mounted.

BACKGROUND ART

For example, some of circuit modules (i.e., system circuit modules including system LSIs and/or microcomputers) that include a plurality of elements may require a plurality of power supplies. Thus, a circuit board (main substrate) on which such a circuit module is mounted, for example, is often provided with an auxiliary power supply circuit for generating a plurality of types of power from a main power supply. Japanese Unexamined Patent Application Publication No. 2009-38950 (JP 2009-38950 A) illustrates a micro power supply module (102) serving as such an auxiliary power supply circuit. The reference signs within parentheses in BACKGROUND ART correspond to those used in the reference document. The micro power supply module (102) is configured to include: a power supply IC (101) incorporating switching elements (6, 7); a first noise-absorbing capacitor (4); and a second noise-absorbing capacitor (5). The first noise-absorbing capacitor (4), the power supply IC (101), and the second noise-absorbing capacitor (5) of the micro power supply module (102) are disposed side by side along a component placement surface (see, for example, FIG. 1 of the publication).

RELATED ART DOCUMENTS

Patent Documents

Patent Document 1: JP 2009-38950 A

SUMMARY OF THE DISCLOSURE

Problem to be Solved by Various Aspects of the Disclosure

Because the micro power supply module (102) is disposed such that the power supply IC (102) and the capacitors (4, 5) are side by side along the component placement surface, an area measured along the component placement surface tends to be large. Accordingly, when the micro power supply module (102) is mounted on, for example, a circuit board (main substrate) on which a circuit module is mounted, the area of the main substrate may be large. This may hinder size reduction of the main substrate and a semiconductor device including the main substrate, which may lead to an increase in cost.

In view of the above circumstances, what is desired is to provide a technique for making a smaller-sized semiconductor device that includes a power supply circuit to supply power to a circuit formed on a main substrate equipped with a circuit module.

Means for Solving the Problem

A semiconductor device provided in view of the above circumstances includes: a circuit module including a module substrate and a circuit element mounted on the module substrate; and a main substrate on which the circuit module is mounted. In one aspect, the semiconductor device further includes a power supply circuit to supply power to at least a circuit formed on the module substrate. The power supply circuit includes: a voltage generating circuit to output a predetermined output voltage; a first capacitor; and a second capacitor larger in capacity than the first capacitor. The voltage generating circuit and the first capacitor are mounted on the module substrate. The second capacitor is mounted on the main substrate.

Capacitors, in general, increase in bulk in accordance with their capacities. The second capacitor is thus larger in bulk than the first capacitor. In the present structure, the second capacitor larger in bulk is not mounted on the module substrate, making it possible to prevent the circuit module from increasing in size. For example, the module substrate of the circuit module mounted on the main substrate tends to have a lower degree of component mounting flexibility than the main substrate. The second capacitor larger in bulk, however, is not mounted on the module substrate, so that more efficient wiring is enabled. This makes it possible to reduce the size of the circuit module so as to enable the semiconductor device, which includes the circuit module, to be made smaller in size. Because the second capacitor is mounted on the main substrate on which the circuit module is mounted, a significant increase in the wiring distance between the second capacitor and the voltage generating circuit is avoidable. As just described, the present structure enables the semiconductor device, which includes the power supply circuit to supply power to a circuit formed on the main substrate equipped with the circuit module, to be made smaller in size.

Further features and advantages of the semiconductor device will be apparent from the description of embodiments given below with reference to the drawings.

DETAILED DESCRIPTION

Embodiments of a semiconductor device will be described below with reference to the drawings. As illustrated in the schematic exploded perspective view of FIG. 1, a semiconductor device 10 is configured to include a main substrate 5 and a circuit module 1. At least the circuit module 1 is mounted on a first surface (main substrate first surface 5a) of the main substrate 5. In this embodiment, the circuit module 1 includes: a system LSI (processor) 2; memories 3 that operate in conjunction with the system LSI 2; a portion of a power supply circuit 9 (first capacitors 6 and a voltage generating circuit 8 that includes a power supply IC 81); and a module substrate 4 including a module substrate first surface 4a on which the system LSI 2, the memories 3, and the portion of the power supply circuit 9 are mounted.

Figure 2:
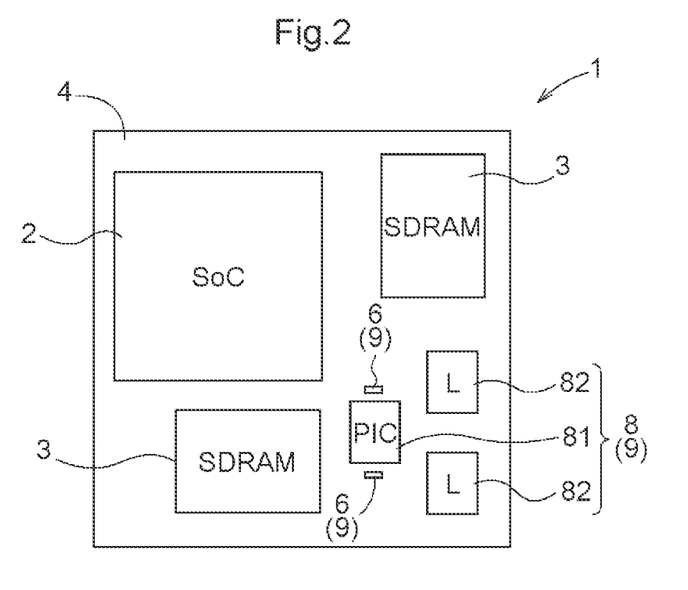
FIG. 2 is a component arrangement diagram of a circuit module.

In the present embodiment, a system on a chip (SoC) serving as the system LSI 2, two synchronous dynamic random access memories (SDRAMs) serving as the memories 3, the power supply IC 81 (power IC (PIC)) serving as a portion of the power supply circuit 9, two inductors 82 also serving as a portion of the power supply circuit 9, and the two first capacitors 6 also serving as a portion of the power supply circuit 9 are mounted on the module substrate 4 as illustrated in the component arrangement diagram of FIG. 2. As will be described below, the present embodiment involves providing the voltage generating circuit 8 including the power supply IC 81 and the inductors 82. Semispherical connection terminals T connected to the main substrate 5 are disposed in a regular arrangement on a module substrate second surface 4b of the circuit module 1 (i.e., a surface thereof facing the main substrate first surface 5a) opposite to the module substrate first surface 4a (see, for example, FIG. 4 and FIG. 6). Specifically, the circuit module 1 is configured to include the connection terminals T of a ball grid array (BGA) type and is mounted on the main substrate first surface 5a.

As mentioned above, the SoC is illustrated as being the system LSI 2 in this embodiment. The system LSI 2, however, may be a system in a package (SiP). Examples of the SoC include a semi-custom LSI, such as an application specific integrated circuit (ASIC), and a general-purpose LSI, such as an application specific standard processor (ASSP). The ASIC is not limited to a gate array or a cell-based IC (standard cell) but may include a programmable logic device (PLD), such as a field programmable gate array (FPGA) and a programmable logic array (PLA).

The SDRAMs are preferably, for example, double data rate3 (DDR3) SDRAMs or double data rate4 (DDR4) SDRAMs. Although the SDRAMs are illustrated as being the memories 3 in this embodiment, each memory 3 may be a memory of any other structure, such as a flash memory or a static RAM (SRAM).

As mentioned above, the memories 3 operate in conjunction with the system LSI 2. Thus, signal terminals (such as an address terminal, a data terminal, and a control terminal) of the memories 3 are connected only to the system LSI 2 on the module substrate 4. In the present embodiment, not only power for driving the memories 3 but also power for driving input/output members (such as terminal input/output pads) of the system LSI 2 that are connected to the memories 3 is generated by the voltage generating circuit 8 mounted on the module substrate 4.

Figure 3:
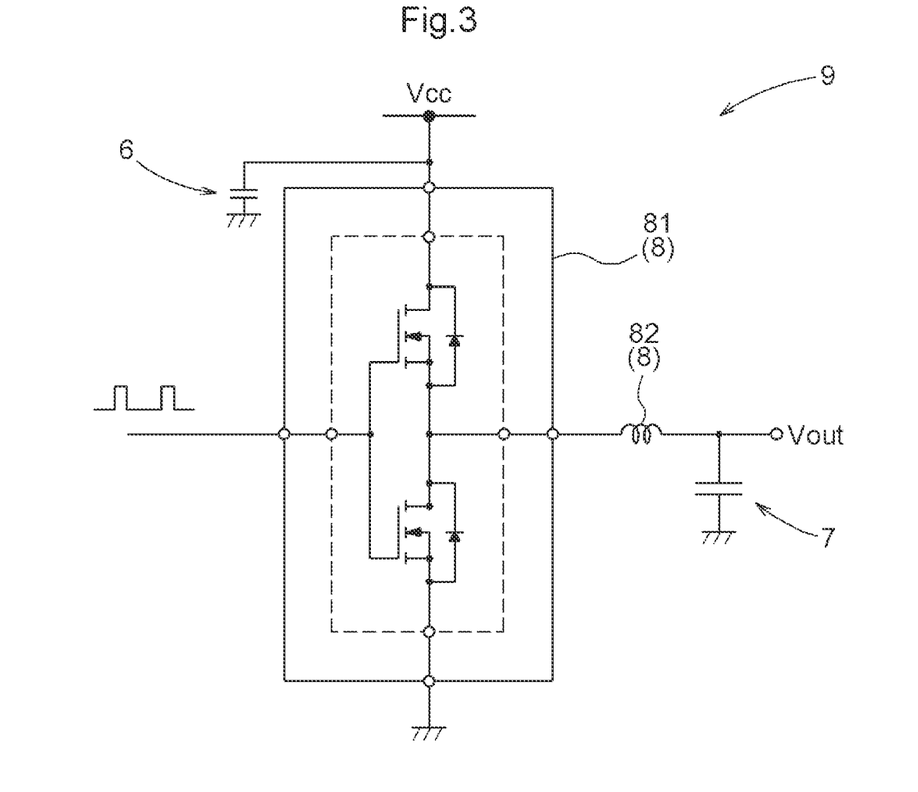
FIG. 3 is a schematic circuit block diagram illustrating a configuration of a power supply circuit.

FIG. 3 illustrates a schematic circuit block diagram of the power supply circuit 9 including the voltage generating circuit 8. The power supply circuit 9 supplies power to at least a circuit formed on the module substrate 4. The power supply circuit 9 is able to supply power to a circuit formed at any location on the main substrate 5 including the module substrate 4. As used herein, the term "circuit formed on the main substrate 5" refers to any of a circuit formed in the circuit module 1, a circuit formed at any location on the main substrate 5 except the circuit module 1, and a circuit formed at any location on the main substrate 5 including the circuit module 1. As illustrated in FIG. 3, the power supply circuit 9 is a switching regulator (switching power supply circuit) that includes: the voltage generating circuit 8 including the power supply IC 81 and the inductors 82; the first capacitors 6; and second capacitors 7. As used herein, the term "power" encompasses a "voltage" and a "current". The power supply circuit 9 (or the voltage generating circuit 8) outputs a predetermined constant output voltage Vout within a range up to a predetermined maximum output current.

The power supply IC 81 forms a portion of the switching power supply circuit incorporating switching elements and operates in conjunction with the inductors 82 so as to output the output voltage Vout determined in advance in accordance with an input voltage Vcc. The switching elements are controlled in accordance with a switching control signal from a switching control circuit (not illustrated). The switching control circuit sets the duty of the switching control signal in accordance with the input voltage Vcc and a target output voltage (ideal output voltage Vout). The output voltage Vout is preferably fed back to the switching control circuit such that the switching control circuit performs feedback control on the switching elements.

Each first capacitor 6 is a capacitor (bypass capacitor) to absorb variations in the input voltage Vcc of a high frequency (e.g., a frequency equivalent to a harmonic component in a switching frequency) resulting from switching of the power supply IC 81. The capacity of each first capacitor 6 is, for example, about 0.01 [μF] to about 0.1 [μF]. In many cases, ceramic capacitors are used as the first capacitors 6. Each second capacitor 7 is a capacitor (smoothing capacitor) to smooth a ripple component in a low frequency (e.g., a switching frequency) of the output voltage Vout resulting from switching of the power supply IC 81. The capacity of each second capacitor 7 is 10 [μF] or higher. The second capacitors 7 are capacitors larger in capacity than the first capacitors 6. Electrolytic capacitors or ceramic capacitors, for example, are used as the second capacitors 7. Because capacitors, in general, increase in bulk as they increase in capacity, assuming that they have the same properties, the second capacitors 7 are larger in size than the first capacitors 6.

Figure 1:
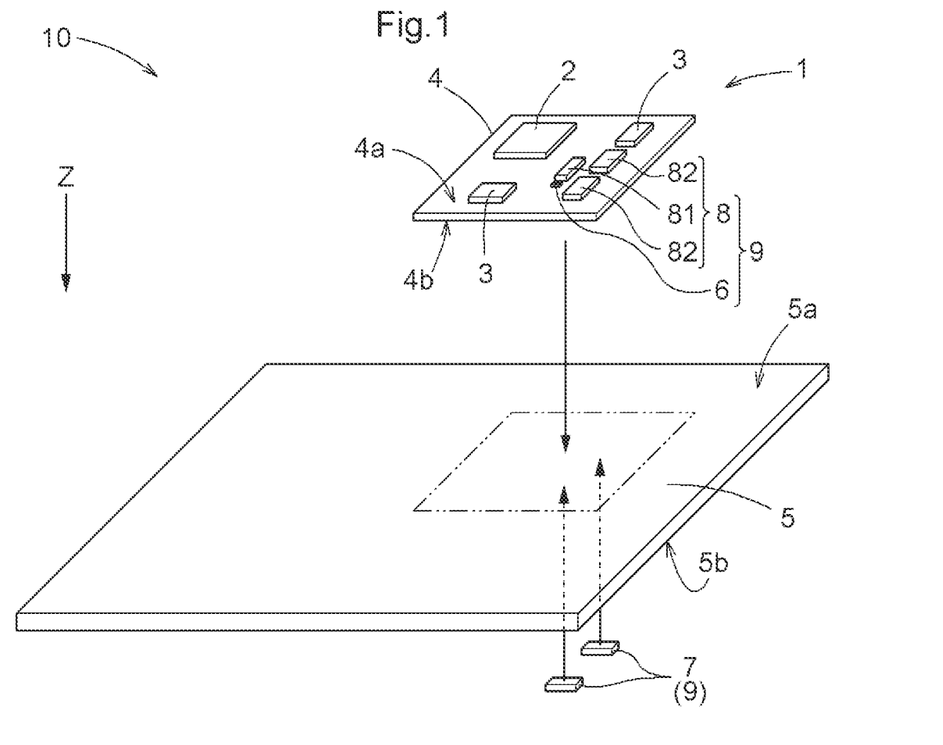
FIG. 1 is a schematic exploded perspective view of a semiconductor device.

In the present embodiment, the voltage generating circuit 8 and the first capacitors 6 are mounted on the module substrate 4 as illustrated in FIGS. 1 and 2, and the second capacitors 7 are mounted on the main substrate 5 as illustrated in FIG. 1. Specifically, the second capacitors 7 larger in capacity and bulk are mounted not on the module substrate 4 but on the main substrate 5, thus limiting or preventing not only an increase in the size of the module substrate 4 but also an increase in the size of the circuit module 1. The voltage generating circuit 8 on the module substrate first surface 4a is electrically connected to the second capacitors 7 through through holes (not illustrated) defined in the module substrate 4 and the main substrate 5.

Figure 4:
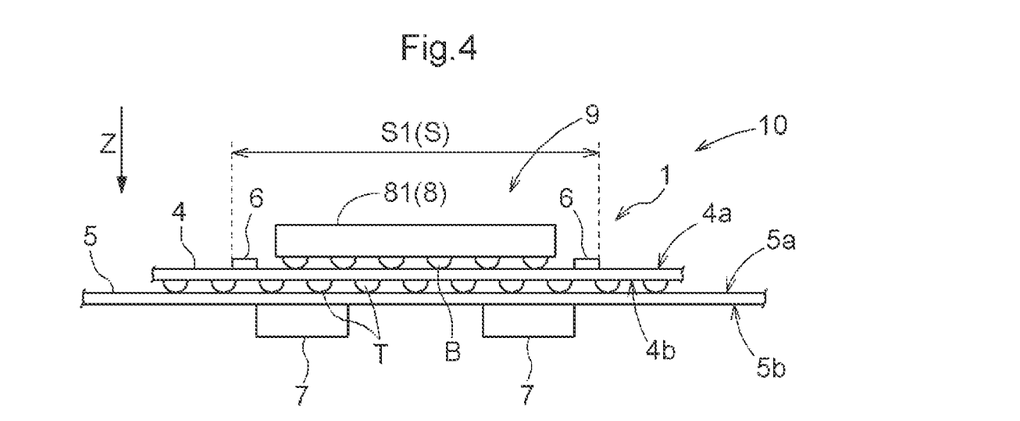
FIG. 4 is a schematic cross-sectional view of a semiconductor device according to one example.

As illustrated in the schematic cross-sectional view of FIG. 4, a more preferable approach involves: mounting the circuit module 1, with the voltage generating circuit 8 and the first capacitors 6 mounted on the module substrate 4, on the main substrate first surface 5a; and mounting the second capacitors 7 on a main substrate second surface 5b. As illustrated in FIG. 4, overlapping the circuit module 1 and the second capacitors 7 in a plan view in a direction Z perpendicular to the main substrate first surface 5a (i.e., as viewed in the direction Z) makes it possible to reduce an area (mounting area S) occupied by the power supply circuit 9 as viewed in the direction Z.

In the mode illustrated in FIG. 4, the voltage generating circuit 8 and the second capacitors 7 overlap as viewed in the direction Z. This makes it possible to further reduce the area (mounting area S) occupied by the power supply circuit 9 as viewed in the direction Z and to connect the voltage generating circuit 8 to the second capacitors 7 at short distances in the direction Z perpendicular to the main substrate 5 and the module substrate 4. Referring to FIG. 4, the power supply IC 81 is also of a BGA type and includes, on a surface thereof facing the module substrate first surface 4a, a plurality of semispherical connection terminals B. The voltage generating circuit 8 is connected to the second capacitors 7 through the connection terminals B of the power supply IC 81 and the connection terminals T of the circuit module 1 in the direction Z perpendicular to the main substrate 5 and the module substrate 4.

Figure 5:
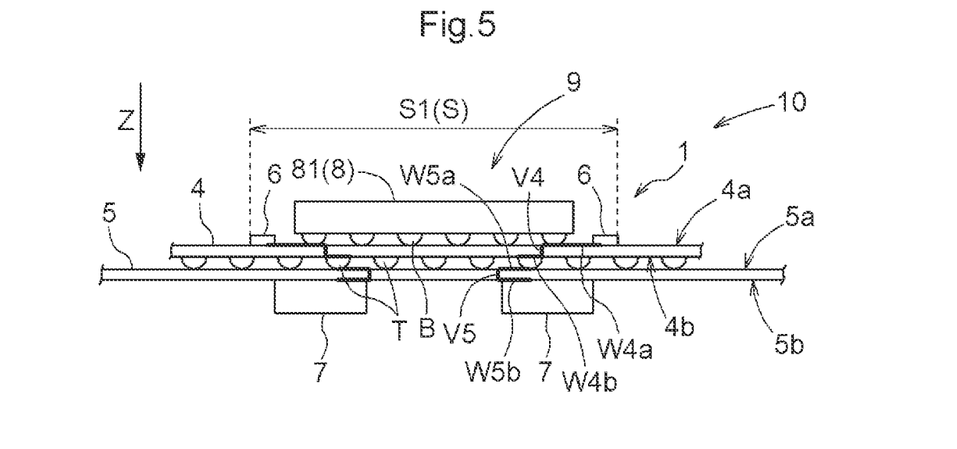
FIG. 5 is a diagram schematically illustrating exemplary wiring routes between a power generating circuit and second capacitors.

FIG. 5 schematically illustrates exemplary wiring routes between the voltage generating circuit 8 and the second capacitors 7. The voltage generating circuit 8 is connected to the first capacitors 6 through, for example, first wiring patterns W4a on the module substrate first surface 4a. Some of the connection terminals T disposed on the module substrate second surface 4b are connected to second wiring patterns W5a on the main substrate first surface 5a, and these connection terminals T are connected to the first wiring patterns W4a through first via holes V4 connecting the module substrate first surface 4a and the module substrate second surface 4b. These connection terminals T are connected to connection terminal patterns W4b on the module substrate second surface 4b. Connecting the first wiring patterns W4a to the connection terminal patterns W4b through the first via holes V4 connects these connection terminals T to the first wiring patterns W4a. Third wiring patterns W5b disposed on the main substrate second surface 5b and connected with the second capacitors 7 are connected to the second wiring patterns W5a through second via holes V5 connecting the main substrate first surface 5a and the main substrate second surface 5b.

If the second capacitors 7 are mounted on the main substrate 5 as described above, the present embodiment would be able to install wiring at short distances in the direction Z perpendicular to the substrate surface of the main substrate 5 without having to divert wiring in a direction along the substrate surface of the main substrate 5 or install wiring in an inner wiring layer of the main substrate 5. Accordingly, if the second capacitors 7 are mounted on the main substrate 5, the present embodiment would be able to connect the second capacitors 7 to the voltage generating circuit 8 without increasing the number of wiring layers of the main substrate 5.

In the present embodiment, the power supply circuit 9 has been illustrated as generating a single type of power. The power supply circuit 9, however, may generate a plurality of types of power. When the power supply circuit 9 generates a plurality of types of power, the output voltage Vout may be the same voltage between different types of power. If rated voltages for power supply destinations are the same, different types of power may desirably be supplied thereto in consideration of a load on the power supply circuit 9 when a total power consumption is high. If rated voltages for power supply destinations are the same, the supply destinations may preferably operate with different types of power in order to prevent power supply noise caused by an operation of one of the supply destinations from exerting influence on the other supply destinations.

Figure 6:
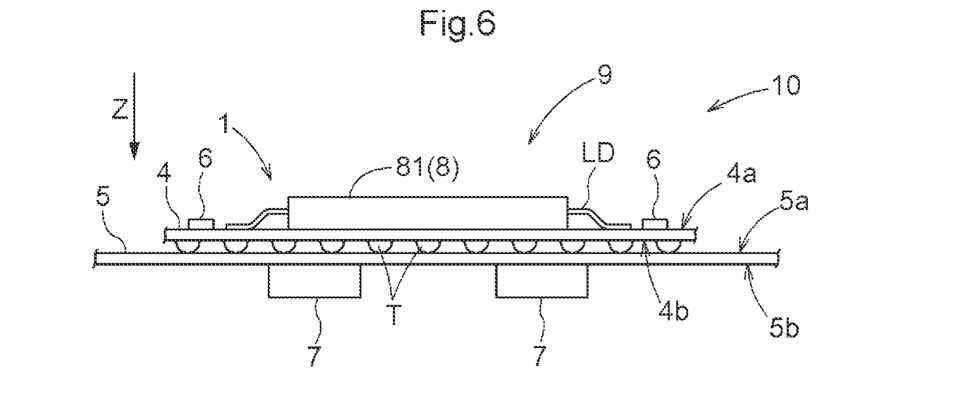
FIG. 6 is a schematic cross-sectional view of a semiconductor device according to another example

Referring to FIG. 4, the power supply IC 81 has been illustrated as being of a ball grid array (BGA) type including the semispherical connection terminals B. The type of the power supply IC 81 including the connection terminals between its body (package) and the module substrate first surface 4a is not limited to a BGA type. The power supply IC 81 may be, for example, a quad flat J-leaded package (QFJ) or a small outline J-leaded package (SOJ) including, on a lower portion of the IC body (i.e., a surface thereof facing the module substrate first surface 4a), connections between the connection terminals of the power supply IC 81 and the module substrate 4. As illustrated in FIG. 6, the power supply IC 81 may be a small outline L-leaded package (SOP) or a quad flat gull wing leaded package (QFP) including L-shaped connection terminals LD not on the lower portion of the IC body but on the sides of the IC body.

Figure 7:
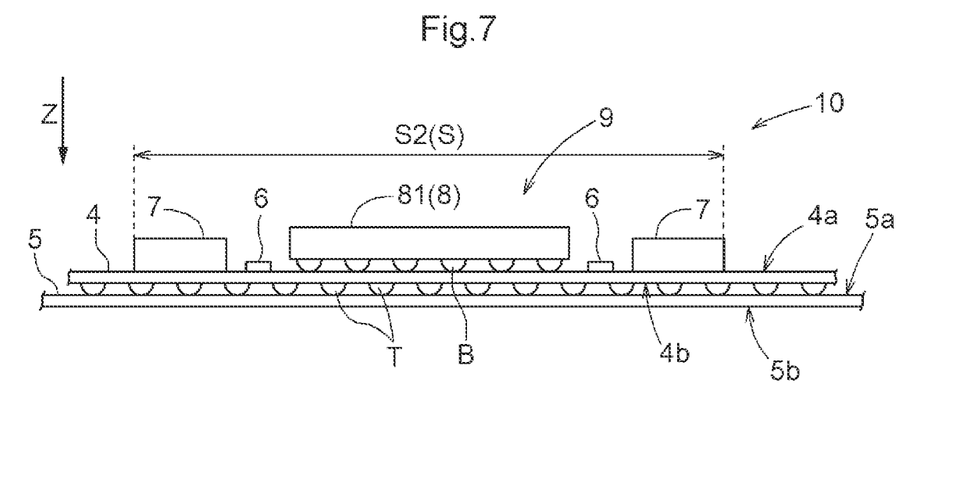
FIG. 7 is a schematic cross-sectional view of a semiconductor device according to a comparative example.

FIG. 7 illustrates a schematic cross-sectional view of a semiconductor device 10 according to a comparative example. As illustrated in FIGS. 1, 4, and 6, the semiconductor device 10 according to the present embodiment has the voltage generating circuit 8 and the first capacitors 6 mounted on the module substrate 4 and has the second capacitors 7 mounted on the main substrate 5. The semiconductor device 10 according to the comparative example illustrated in FIG. 7, however, has an entirety of the power supply circuit 9 mounted on the module substrate 4. Specifically, the semiconductor device 10 according to the comparative example has the voltage generating circuit 8, the first capacitors 6, and the second capacitors 7 mounted on the module substrate 4. Thus, an area (mounting area S) occupied by the power supply circuit 9 as viewed in the direction Z may be large, resulting in an increase in the size of the module substrate 4 and an increase in the size of the circuit module 1. As is clear from the comparison between FIG. 4 (which illustrates the circuit module 1 including the power supply IC 81 of a BGA type) and FIG. 7, the mounting area S (second mounting area S2) of the power supply circuit 9 in the circuit module 1 according to the comparative example is larger than the mounting area S (first mounting area S1) of the power supply circuit 9 in the circuit module 1 according to the present embodiment illustrated in FIG. 4.

In the present embodiment described with reference to, for example, FIGS. 1, 4, and 6, the second capacitors 7 larger in bulk are not mounted on the module substrate 4 as illustrated above, thus making it possible to prevent the circuit module 1 from increasing in size. Because the circuit module 1 is reducible in size, the present embodiment also enables the semiconductor device 10, which includes the circuit module 1, to be made smaller in size. In other words, the present embodiment is able to make the smaller-sized semiconductor device 10 including the power supply circuit 9 to supply power to a circuit formed on the main substrate 5 equipped with the circuit module 1.

Alternative Embodiments

Alternative embodiments will be described below. A structure of each embodiment described below does not necessarily have to be used solely but may be used in combination with structure(s) of other embodiment(s) as long as no contradiction arises.

(1) In the above description, the circuit module 1 has been illustrated as being a multichip module (system multichip module) including the module substrate 4, the voltage generating circuit 8, and the system LSI 2 (processor) to which power generated by the voltage generating circuit 8 is to be supplied and having the system LSI 2 mounted on the module substrate first surface 4a. The circuit module 1, however, is not limited to this type. Alternatively, the circuit module 1 may be a multichip module (power supply multichip module) including the module substrate 4 and the voltage generating circuit 8. More specifically, the circuit module 1 may be a multichip module in which a supply destination for power generated by the voltage generating circuit 8 is not mounted on the module substrate 4.

When the circuit module 1 is a power supply multichip module such as one described above, the circuit module 1 preferably includes more than one voltage generating circuit 8 so as to be able to output a plurality of types of power. The circuit module 1 is configurable such that circuits for supplying the plurality of types of power to the main substrate 5 are integrated. As previously mentioned, the term "power" encompasses a "voltage" and a "current", and the power supply circuit 9 (or the voltage generating circuit 8) outputs a predetermined constant output voltage Vout within a range up to a predetermined maximum output current. The plurality of types of power may include power for which the output voltage Vout is the same.

When the circuit module 1 is a system multichip module including the module substrate 4, the voltage generating circuit 8, and the system LSI 2 to which power generated by the voltage generating circuit 8 is to be supplied as described above with reference to, for example, FIGS. 1, 4, and 6, a circuit serving as a supply destination for power from the power supply circuit 9 (i.e., a circuit formed on the main substrate 5) is preferably limited to a circuit formed in the circuit module 1. In other words, the power supply circuit 9 for exclusive use may be included in the circuit module 1. In the present embodiment, only the second capacitors 7 in the power supply circuit 9 are excluded from the circuit module 1. This allows a core circuit (which is the voltage generating circuit 8) of the power supply circuit 9 for exclusive use to be included in the circuit module 1 and enables size reduction of the circuit module 1.

In many cases, wiring for power transmission is installed in an inner wiring layer of a substrate. Providing the power supply circuit 9 for exclusive use in the circuit module 1, however, eliminates the need for installing such inner layer power wiring in the main substrate 5. This accordingly enables the main substrate 5 to be simplified in structure. Although the second capacitors 7 need to be connected to the voltage generating circuit 8 through the main substrate 5, through holes and mounting lands of the second capacitors 7 sufficiently serve as wiring for this connection. Consequently, if the second capacitors 7 are mounted on the main substrate 5, the main substrate 5 would not require any inner layer power wiring for transmission of the output voltage Vout from the voltage generating circuit 8 formed in the circuit module 1.

When the circuit module 1 is a system multichip module including the module substrate 4, the voltage generating circuit 8, and the system LSI 2 to which power generated by the voltage generating circuit 8 is to be supplied, a circuit serving as a supply destination for power from the power supply circuit 9 (i.e., a circuit formed on the main substrate 5) is naturally not limited to a circuit formed in the circuit module 1 but may be a circuit formed at any location on the main substrate 5 including the circuit module 1. In other words, the circuit module 1 (system multichip module) including the voltage generating circuit 8 may supply power to both of a circuit formed in the circuit module 1 and a circuit formed not in the circuit module 1 but on the main substrate 5.

When the circuit module 1 is a power supply multichip module including the module substrate 4 and the voltage generating circuit 8 but not including the system LSI 2 to which power generated by the voltage generating circuit 8 is to be supplied, a circuit serving as a supply destination for power from the power supply circuit 9 (i.e., a circuit formed on the main substrate 5) is a circuit formed at any location on the main substrate 5 except the circuit module 1 (power supply multichip module). A system circuit (which is implemented by a system multichip module or a single system LSI) mounted on the main substrate 5, for example, may be changed in accordance with a product. System circuits, in general, require a plurality of types of power, and power supply specifications, such as types of power and current consumption for each type of power, differ for each system circuit. Accordingly, a suitable power supply multichip module is preferably mounted on the main substrate 5 in accordance with a system circuit. Such a power supply multichip module is able to provide a flexible power supply in accordance with a product.

A system multichip module including no voltage generating circuit 8 and a power supply multichip module (circuit module 1) may naturally be mounted on the main substrate 5. More than one circuit module 1 may be mounted on the main substrate 5. For example, more than one power supply multichip module (circuit module 1) may be mounted on the main substrate 5. A system multichip module (circuit module 1) including the voltage generating circuit 8 and a power supply multichip module (circuit module 1) may be mounted on the main substrate 5.

(2) In the above description, the second capacitors 7 have been illustrated as being mounted on the main substrate second surface 5b as illustrated in, for example, FIGS. 1, 4, and 6. The second capacitors 7, however, may be mounted on the main substrate first surface 5a. In this case, the circuit module 1 and the second capacitors 7 do not overlap as viewed in the direction Z. When the packaging density of the main substrate 5 is low and space for component placement and wiring is allowed, the second capacitors 7 may alternatively be mounted on the main substrate first surface 5a. In this case, wiring distances between the voltage generating circuit 8 and the second capacitors 7 are longer than when the circuit module 1 and the second capacitors 7 overlap as viewed in the direction Z. The voltage that the second capacitors 7 smooth, however, varies at frequencies lower than those for the first capacitors 6. Accordingly, influence exerted on the second capacitors 7 by longer wiring distances is smaller than that exerted on the first capacitors 6 by longer wiring distances.

When the second capacitors 7 are mounted on the main substrate first surface 5a, the area (mounting area S) occupied by the power supply circuit 9 as viewed in the direction Z with the inclusion of the main substrate 5 is approximately equal to the area in the comparative example illustrated in FIG. 7. Unlike the comparative example, however, the second capacitors 7 are not mounted on the module substrate 4, so that the module substrate 4 is prevented from increasing in size. Consequently, when the packaging density of the main substrate 5 is low and space for component placement and wiring is allowed, the semiconductor device 10 would be prevented from increasing in size if the second capacitors 7 are mounted on the main substrate first surface 5a.

Electrolytic capacitors are often used as the second capacitors 7 larger in capacity than the first capacitors 6. A discrete component (such as a connector) including a lead passing through the main substrate 5 may be mounted on the main substrate first surface 5a. In such a case, components are often mounted on the main substrate second surface 5b not by a reflow method but by a flow method. Surface-mount electric field capacitors, in general, cannot be mounted by a flow method. Large capacity products are often not available for use as surface-mount electric field capacitors. Placing an electrolytic capacitor, which is a discrete component, on the main substrate first surface 5a, however, enables a lead terminal to be mounted on the main substrate second surface 5b by a flow method. This makes it unnecessary to take into account restrictions on capacity mentioned above. Accordingly, the second capacitors 7 may be mounted on the main substrate first surface 5a. In any case, size reduction of the circuit module 1 on which the second capacitors 7 are not mounted is promotable.

(3) In the above description, the voltage generating circuit 8 has been illustrated as being a "chopper type" switching power supply circuit. The voltage generating circuit 8, however, is not limited to this type. An insulated side voltage conversion circuit (DC-DC converter) that includes a transformer, for example, may be used as the voltage generating circuit 8.

Summary of Embodiments

A brief summary of the semiconductor device (10) described above will be given below.

A semiconductor device (10) includes: a circuit module (1) including a module substrate (4) and a circuit element (2, 3, 6, 81) mounted on the module substrate (4); and a main substrate (5) on which the circuit module (1) is mounted. In one aspect, the semiconductor device (10) further includes a power supply circuit (9) to supply power to at least a circuit formed on the module substrate (4). The power supply circuit (9) includes: a voltage generating circuit (8) to output a predetermined output voltage (Vout); a first capacitor (6); and a second capacitor (7) larger in capacity than the first capacitor (6). The voltage generating circuit (8) and the first capacitor (6) are mounted on the module substrate (4). The second capacitor (7) is mounted on the main substrate (5).

Capacitors, in general, increase in bulk in accordance with their capacities. The second capacitor (7) is thus larger in bulk than the first capacitor (6). In the present structure, the second capacitor (7) larger in bulk is not mounted on the module substrate (4), making it possible to prevent the circuit module (1) from increasing in size. For example, the module substrate (4) of the circuit module (1) mounted on the main substrate (5) tends to have a lower degree of component mounting flexibility than the main substrate (5). The second capacitor (7) larger in bulk, however, is not mounted on the module substrate (4), so that more efficient wiring is enabled. This makes it possible to reduce the size of the circuit module (1) so as to enable the semiconductor device (10), which includes the circuit module (1), to be made smaller in size. Because the second capacitor (7) is mounted on the main substrate (5) on which the circuit module (1) is mounted, a significant increase in the wiring distance between the second capacitor (7) and the voltage generating circuit (8) is avoidable. As just described, the present structure enables the semiconductor device (10), which includes the power supply circuit (9) to supply power to a circuit formed on the main substrate (5) equipped with the circuit module (1), to be made smaller in size.

The circuit module (1) is preferably mounted on a first surface (5a) of the main substrate (5), and the second capacitor (7) is preferably mounted on a second surface (5b) of the main substrate (5) opposite to the first surface (5a). The circuit module (1) and the second capacitor (7) preferably overlap in a plan view in a direction (Z) perpendicular to the first surface (5a) of the main substrate (5).

Overlapping the circuit module 1 and the second capacitor 7 in the plan view makes it possible to reduce an area (mounting area (S)) occupied by the power supply circuit 9 in the plan view in the semiconductor device (10). This accordingly enables the semiconductor device (10) to be made smaller in size.

When the circuit module (1) is mounted on the first surface (5a) of the main substrate (5) and the second capacitor (7) is mounted on the second surface (5b) of the main substrate (5) opposite to the first surface (5a), the voltage generating circuit (8) and the first capacitor (6) are preferably mounted on a module substrate first surface (4a) that is one of surfaces of the module substrate (4), a plurality of connection terminals (T) is preferably disposed on a module substrate second surface (4b) that is a surface opposite to the module substrate first surface (4a), and the voltage generating circuit (8) and the second capacitor (7) preferably overlap in the plan view.

In this structure, the voltage generating circuit (8) and the second capacitor (7) are connectable at a short distance along the direction (Z) perpendicular to the first surface (5a) of the main substrate (5). If the voltage generating circuit (8) and the second capacitor (7) are mounted on different substrates, this structure would not require diverting wiring in a direction along the substrate surfaces of the module substrate (4) and the main substrate (5) and thus would not increase a wiring distance. Accordingly, wiring is installable at a short distance in the direction (Z) perpendicular to the substrate surfaces of the module substrate (4) and the main substrate (5).

The voltage generating circuit (8) is preferably connected to the first capacitor (6) through a first wiring pattern (W4a) on the module substrate first surface (4a). Some of the connection terminals (T) disposed on the module substrate second surface (4b) are preferably connected to a second wiring pattern (W5a) on the first surface (5a) of the main substrate (5), and these connection terminals (T) are preferably connected to the first wiring pattern (W4a) through a first via hole (V4) connecting the module substrate first surface (4a) and the module substrate second surface (4b). A third wiring pattern (W5b) connected with the second capacitor (7) on the second surface (5b) is preferably connected to the second wiring pattern (W5a) through a second via hole (V5) connecting the first surface (5a) and the second surface (5b) of the main substrate (5).

In this structure, if the second capacitor (7) is mounted on the main substrate (5), wiring would be installable at a short distance in the direction (Z) perpendicular to the substrate surface of the main substrate (5) without having to divert wiring in a direction along the substrate surface of the main substrate (5) or install wiring in an inner wiring layer of the main substrate (5). Consequently, if the second capacitor (7) is mounted on the main substrate (5), this structure is able to connect the second capacitor (7) to the voltage generating circuit (8) without increasing the number of wiring layers in the main substrate (5).

The circuit module (1) is preferably a multichip module that includes the module substrate (4) and a processor (2) to which power generated by the voltage generating circuit (8) is to be supplied.

This structure enables supply of power to the processor (2) at a short wiring distance on the module substrate (4). Because the second capacitor (7) larger in bulk is not mounted on the module substrate (4), this structure enables size reduction of the multichip module and efficient wiring for the processor (2).

When the voltage generating circuit (8) and the first capacitor (6) are mounted on the module substrate first surface (4a) that is one of surfaces of the module substrate (4), a plurality of connection terminals (T) is disposed on the module substrate second surface (4b), and the circuit module (1) is a multichip module that includes the module substrate (4) and a processor (2) to which power generated by the voltage generating circuit (8) is to be supplied, the processor (2) is preferably further mounted on the module substrate first surface (4a).

This structure is able to provide an efficient multichip module that includes the processor (2), the voltage generating circuit (8), and the first capacitor (6) on the module substrate first surface (4a) and is capable of suppling power to the processor (2) on the module substrate (4). Because the multichip module does not include the second capacitor (7) larger in bulk, this structure enables size reduction of the multichip module and efficient wiring for the processor (2).

The voltage generating circuit (8) is preferably a switching power supply circuit. The first capacitor (6) is preferably a bypass capacitor for the voltage generating circuit (8). The second capacitor (8) is preferably a smoothing capacitor to smooth the output voltage (Vout) from the voltage generating circuit (8).

A switching power supply circuit has a higher voltage conversion efficiency and generates less heat than, for example, a linear regulator and thus makes an excellent voltage generating circuit (8). Because voltage generation involves switching operation(s) of switching element(s), noise of a harmonic component in a switching frequency is likely to be superimposed on an input side voltage (Vcc), and a switching frequency ripple is likely to occur in an output voltage (Vout). Thus, the capacitors are connected to the input side and output side of the switching power supply circuit so as to remove the noise and smooth the ripple. The bypass capacitor to remove noise of a harmonic component in a switching frequency at the input side is preferably disposed closer to the voltage generating circuit (8) than the smoothing capacitor to smooth the output voltage (Vout). The bypass capacitor, which copes with a higher frequency than the smoothing capacitor, is smaller in capacity and bulk than the smoothing capacitor. Accordingly, the bypass capacitor is preferably the first capacitor (6) mounted on the module substrate (4) together with the voltage generating circuit (8). The smoothing capacitor, which copes with a lower frequency than the bypass capacitor, is larger in capacity and bulk than the bypass capacitor. Consequently, the smoothing capacitor is preferably the second capacitor (7) mounted on the main substrate (5) separately from the circuit module (1).

DESCRIPTION OF THE REFERENCE NUMERALS 1 circuit module
2 system LSI (processor, circuit element mounted on module substrate)
3 memory (circuit element mounted on module substrate)
4 module substrate
4a module substrate first surface
4b module substrate second surface
5 main substrate
5a main substrate first surface (first surface of main substrate)
5b main substrate second surface (second surface of main substrate)
6 first capacitor (circuit element mounted on module substrate)
7 second capacitor
8 voltage generating circuit
9 power supply circuit
10 semiconductor device
81 power supply IC (voltage generating circuit, circuit element mounted on module substrate)
T connection terminal
V4 first via hole
V5 second via hole
Vout output voltage
W4a first wiring pattern
W5a second wiring pattern
W5b third wiring pattern
Z direction perpendicular to first surface of main substrate

The invention claimed is:

1. A semiconductor device comprising:
a circuit module including a module substrate and a circuit element mounted on the module substrate; and
a main substrate on which the circuit module is mounted, wherein
the semiconductor device further comprises a power supply circuit to supply power to at least a circuit formed on the module substrate,
the power supply circuit includes
a voltage generating circuit to output a predetermined output voltage,
a first capacitor, and
a second capacitor larger in capacity than the first capacitor,
the voltage generating circuit and the first capacitor are mounted on the module substrate, and
the second capacitor is mounted on the main substrate.

2. The semiconductor device according to claim 1, wherein
the circuit module is mounted on a first surface of the main substrate, and the second capacitor is mounted on a second surface of the main substrate opposite to the first surface, and
the circuit module and the second capacitor overlap in a plan view in a direction perpendicular to the first surface of the main substrate.

3. The semiconductor device according to claim 2, wherein
the voltage generating circuit and the first capacitor are mounted on a module substrate first surface that is one of surfaces of the module substrate,
a plurality of connection terminals is disposed on a module substrate second surface that is a surface opposite to the module substrate first surface, and
the voltage generating circuit and the second capacitor overlap in the plan view.

4. The semiconductor device according to claim 3, wherein
the voltage generating circuit is connected to the first capacitor through a first wiring pattern on the module substrate first surface,
some of the connection terminals disposed on the module substrate second surface are connected to a second wiring pattern on the first surface of the main substrate, and these connection terminals are connected to the first wiring pattern through a first via hole connecting the module substrate first surface and the module substrate second surface, and
a third wiring pattern connected with the second capacitor on the second surface is connected to the second wiring pattern through a second via hole connecting the first surface and the second surface of the main substrate.

5. The semiconductor device according to claim 1, wherein
the circuit module is a multichip module that includes the module substrate and a processor to which power generated by the voltage generating circuit is to be supplied.

6. The semiconductor device according to claim 5, wherein
the voltage generating circuit and the first capacitor are mounted on a module substrate first surface that is one of surfaces of the module substrate,
a plurality of connection terminals is disposed on a module substrate second surface that is a surface opposite to the module substrate first surface, and
the processor is further mounted on the module substrate first surface.

7. The semiconductor device according to claim 1, wherein
the voltage generating circuit is a switching power supply circuit,
the first capacitor is a bypass capacitor for the voltage generating circuit, and
the second capacitor is a smoothing capacitor to smooth the output voltage from the voltage generating circuit.

* * * * *